(12) United States Patent
Hwang

(10) Patent No.: US 8,362,514 B2
(45) Date of Patent: Jan. 29, 2013

(54) VERTICAL SEMICONDUCTOR LIGHT EMITTING DEVICE INCLUDING A CAPACITOR

(75) Inventor: Sung Min Hwang, Seoul (KR)

(73) Assignee: LG Innotek, Co., Ltd., Seoul (KR)

( * ) Notice: Subject to any disclaimer, the term of this patent is extended or adjusted under 35 U.S.C. 154(b) by 21 days.

(21) Appl. No.: 12/943,603

(22) Filed: Nov. 10, 2010

(65) Prior Publication Data

US 2011/0266585 A1    Nov. 3, 2011

(30) Foreign Application Priority Data

Apr. 28, 2010    (KR) .................. 10-2010-0039595

(51) Int. Cl.
*H01L 27/15*    (2006.01)
(52) U.S. Cl. .............. 257/99; 257/81; 257/E33.052
(58) Field of Classification Search .............. 257/93, 257/116, E25.032, 81, 84, 98, 99
See application file for complete search history.

(56) References Cited

U.S. PATENT DOCUMENTS

| 5,977,565 | A | * | 11/1999 | Ishikawa et al. ................ 257/81 |
| 6,097,040 | A |  | 8/2000 | Morimoto et al. |
| 2003/0062530 | A1 |  | 4/2003 | Okazaki et al. |
| 2005/0156185 | A1 |  | 7/2005 | Kim et al. |
| 2007/0114545 | A1 | * | 5/2007 | Jang et al. ................ 257/94 |
| 2007/0145391 | A1 |  | 6/2007 | Baik et al. |
| 2008/0129198 | A1 |  | 6/2008 | Feng et al. |
| 2009/0026490 | A1 |  | 1/2009 | Kim et al. |
| 2009/0072257 | A1 | * | 3/2009 | Unno et al. ................ 257/98 |
| 2010/0102355 | A1 | * | 4/2010 | Jeong ................ 257/99 |
| 2010/0187559 | A1 |  | 7/2010 | Han |
| 2011/0095307 | A1 |  | 4/2011 | Hwang |

FOREIGN PATENT DOCUMENTS

| EP | 1 482 566 A2 | 12/2004 |
| EP | 2 315 267 A1 | 4/2011 |
| JP | 2003124517 A | 4/2003 |
| JP | 2008218878 A | 9/2008 |
| KR | 10-2006-0121450 | 11/2006 |
| KR | 100752719 | 8/2007 |
| KR | 20080041816 | 5/2008 |
| KR | 100855356 | 9/2008 |
| KR | 10-0986556 | 10/2010 |

* cited by examiner

*Primary Examiner* — Marcos D. Pizarro
*Assistant Examiner* — Cesar Lopez
(74) *Attorney, Agent, or Firm* — McKenna Long & Aldridge LLP

(57) ABSTRACT

A light emitting device is provided. The light emitting device includes a light emitting structure including a first conductive semiconductor layer, an active layer, and a second conductive semiconductor layer, a first dielectric layer over a part of an upper surface of the light emitting structure, and a pad electrode over the first dielectric layer.

13 Claims, 6 Drawing Sheets

【FIG. 1】
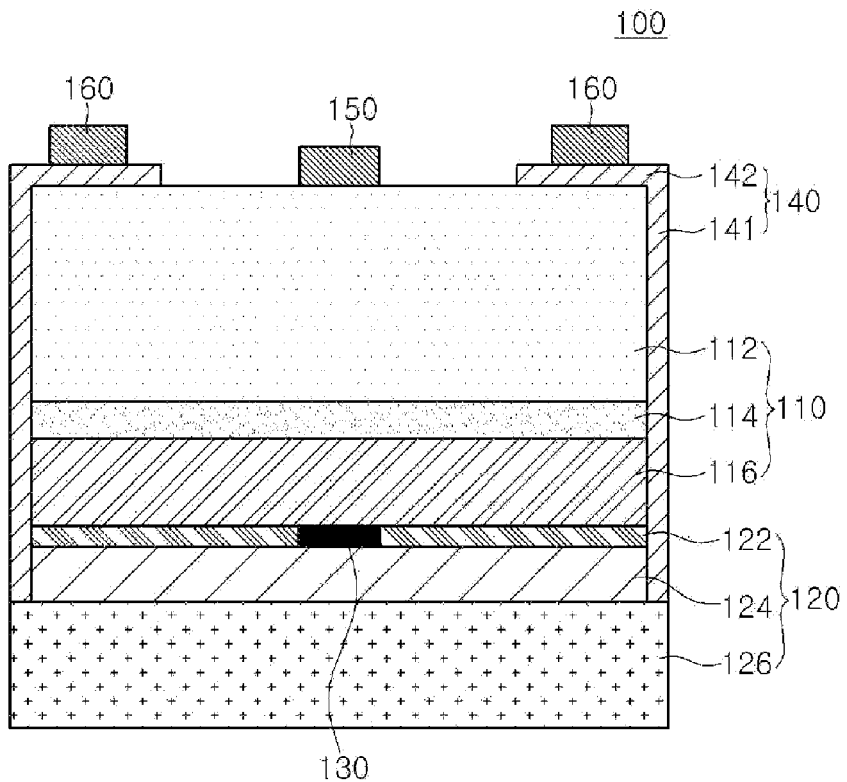
【FIG. 2】
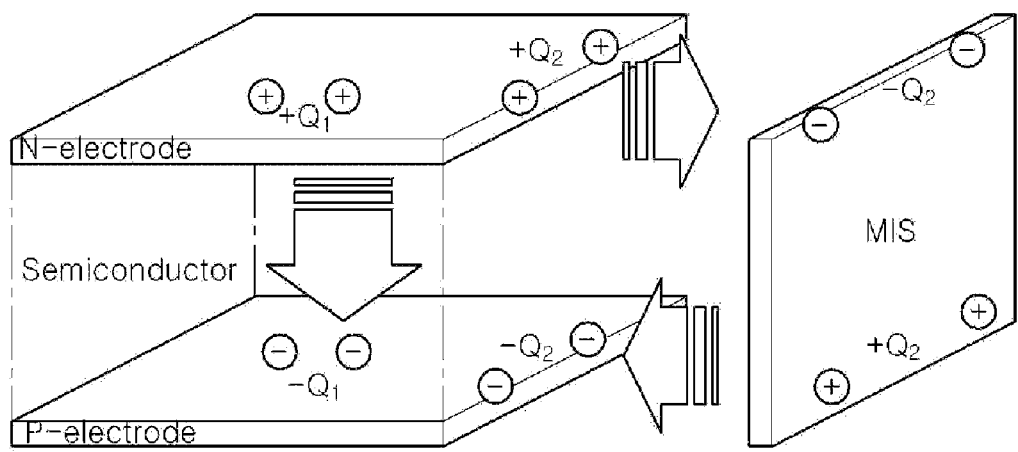

[FIG. 3]
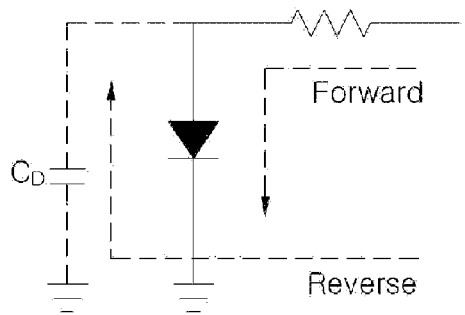
[FIG. 4]
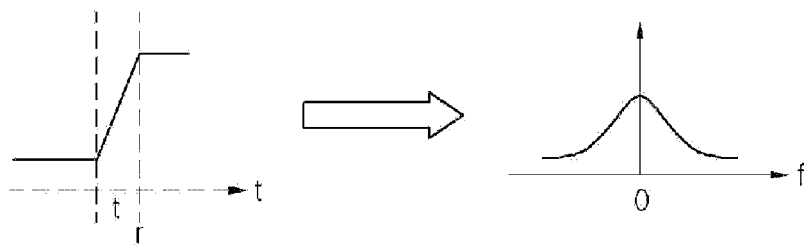
[FIG. 5]
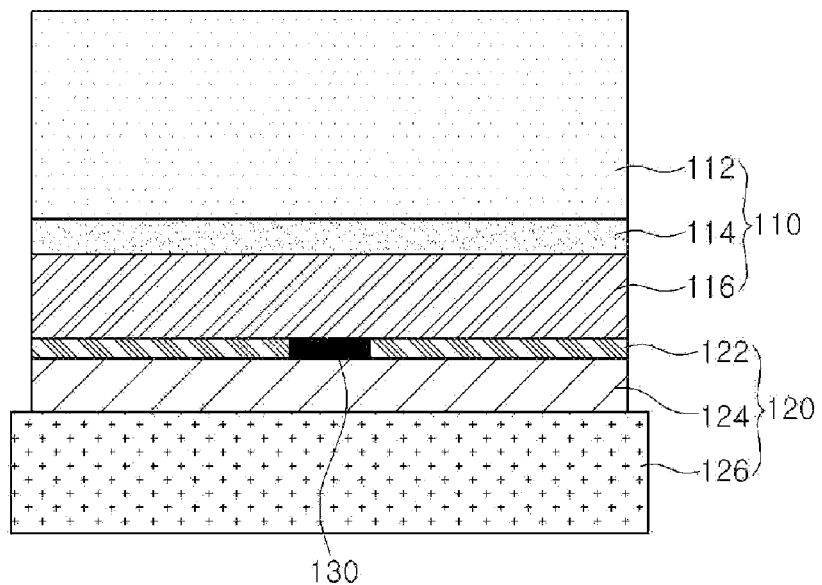

【FIG. 6】
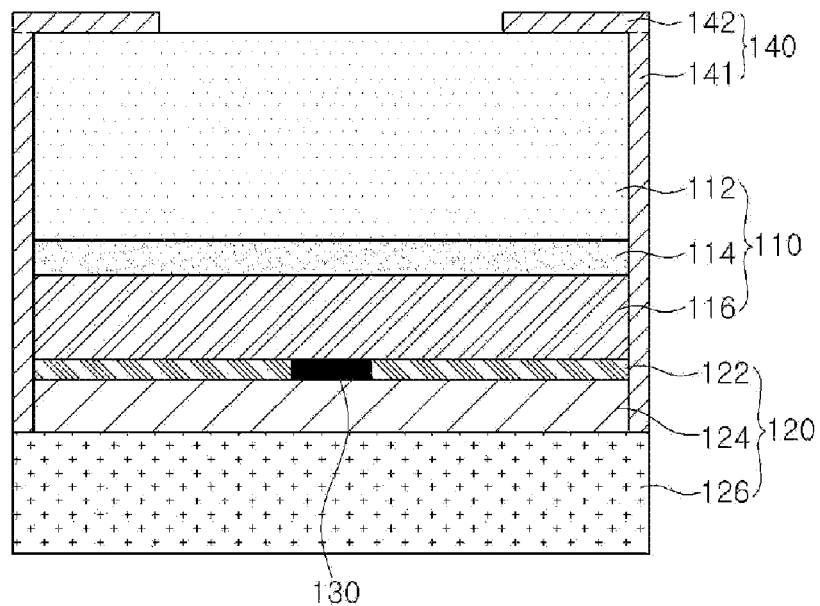
【FIG. 7】
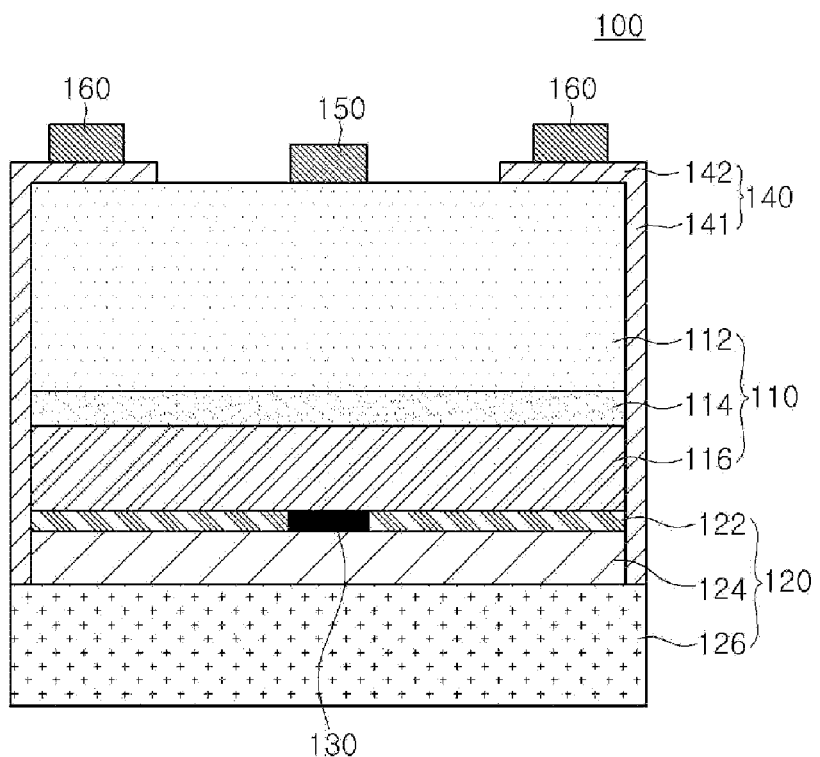

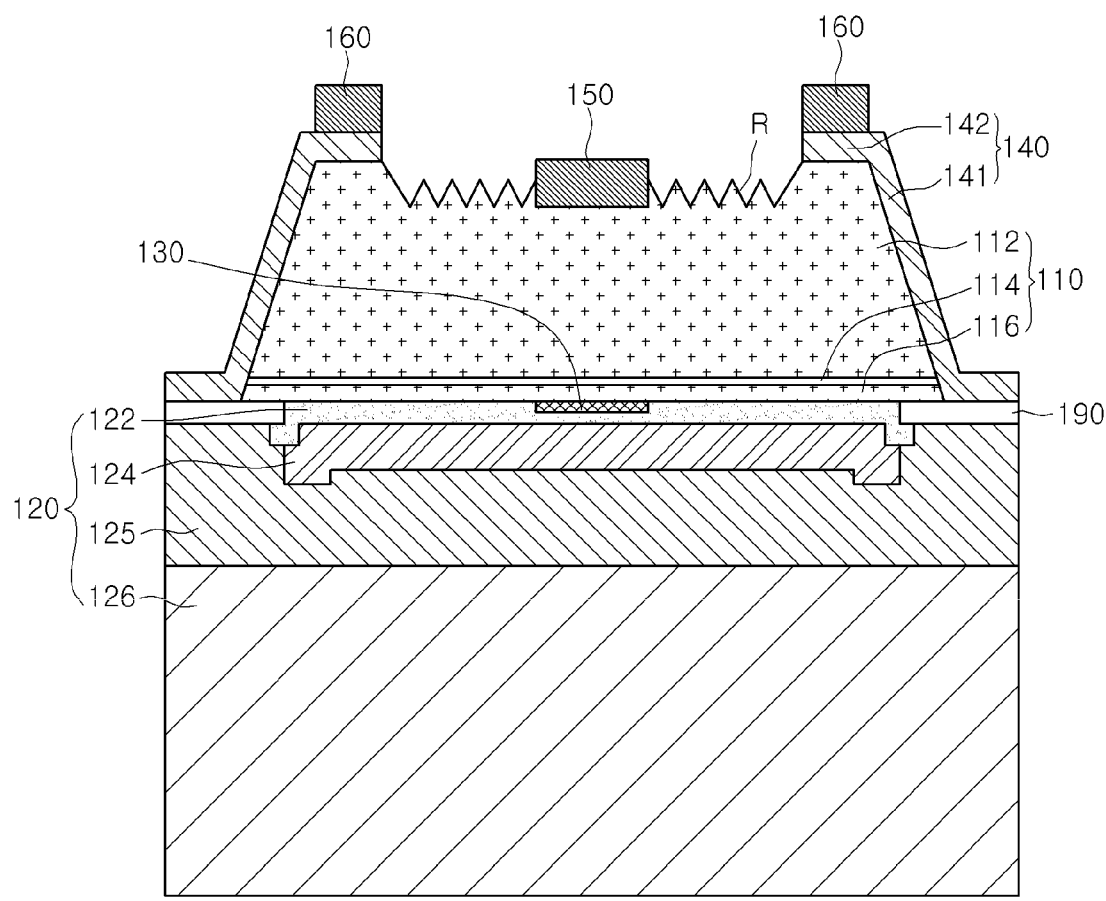
[FIG. 8]

【FIG. 9】
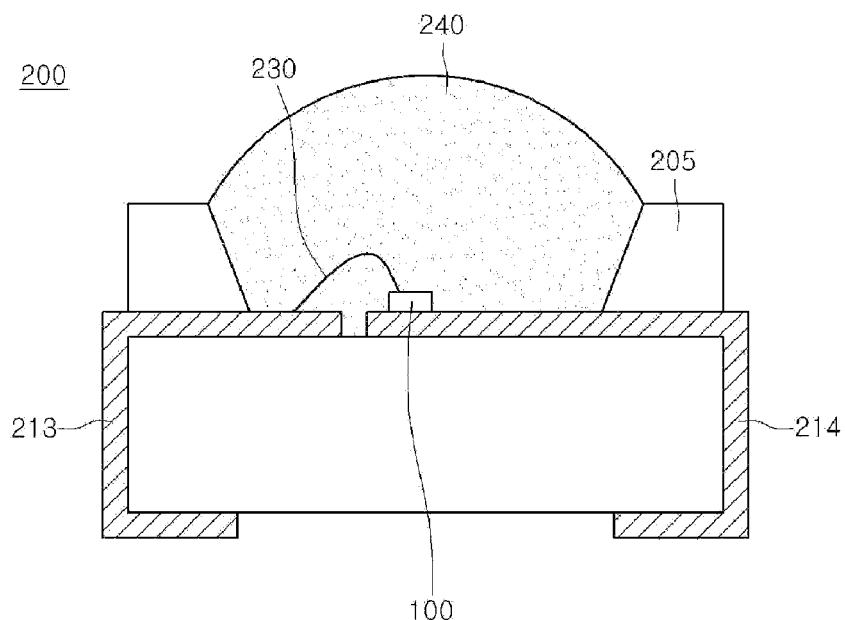
【FIG. 10】
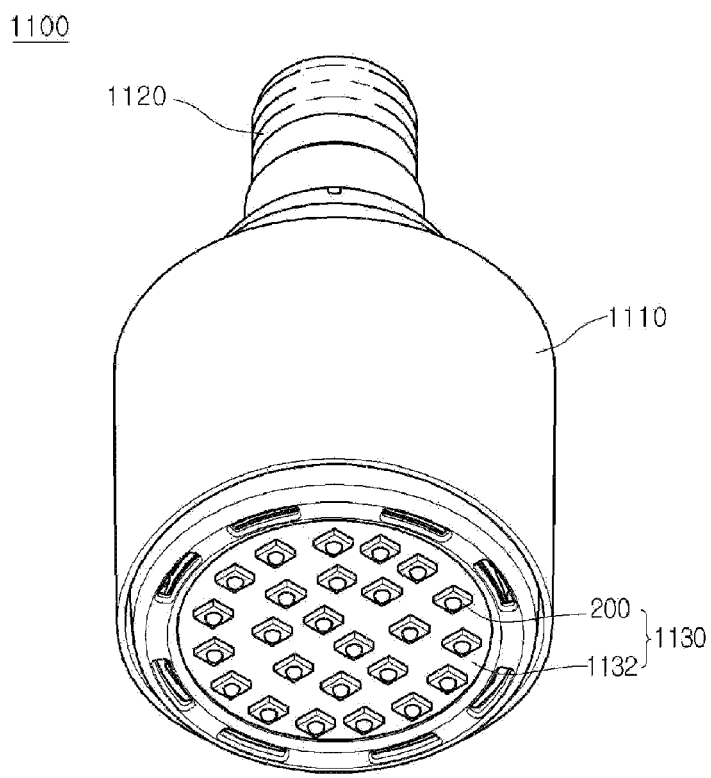

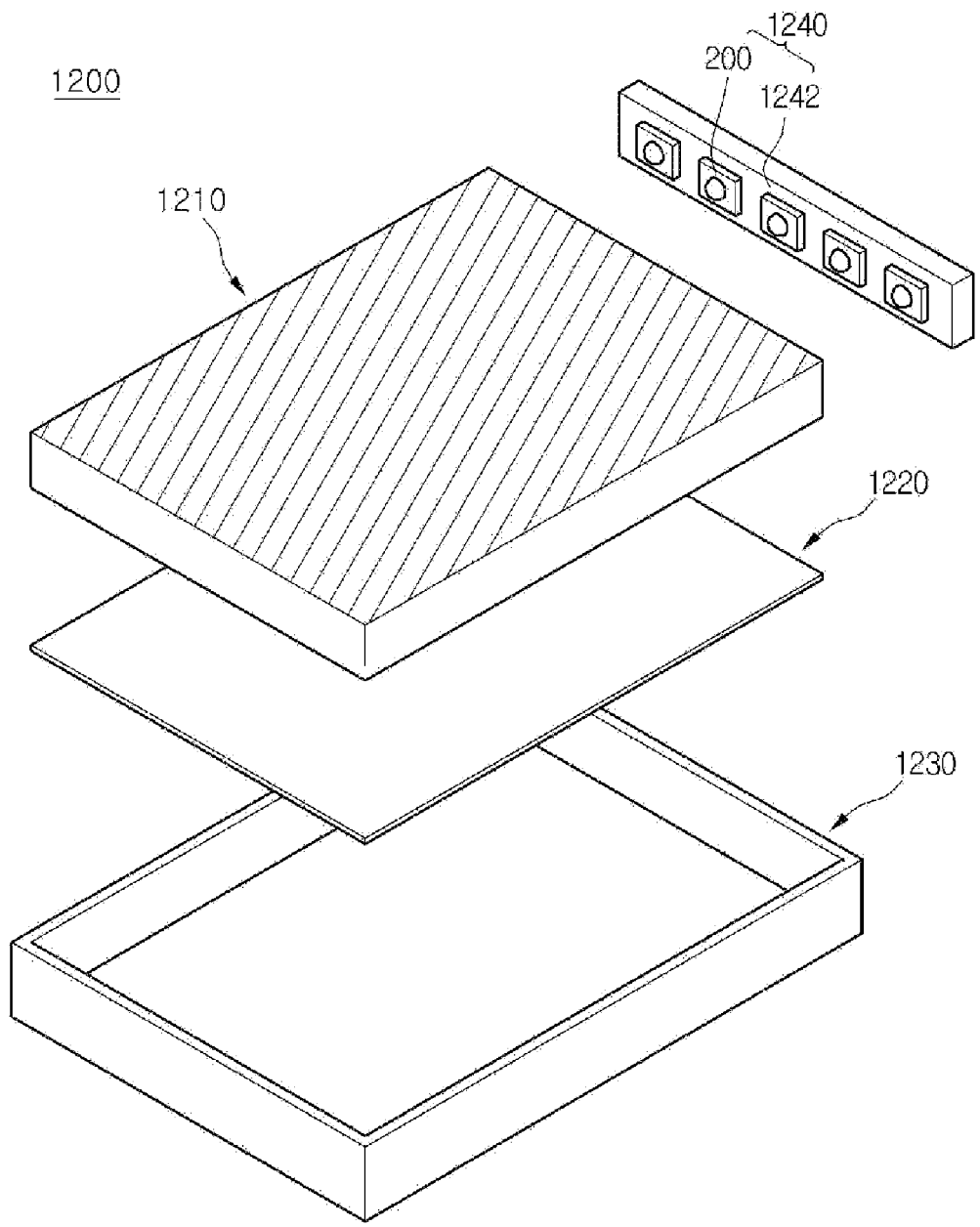
[FIG. 11]

VERTICAL SEMICONDUCTOR LIGHT EMITTING DEVICE INCLUDING A CAPACITOR

CROSS-REFERENCE TO RELATED APPLICATIONS

This application claims the benefit of Korean Patent Application No. 10-2010-0039595 filed on Apr. 28, 2010, which is incorporated by reference in their entirety herein.

BACKGROUND

The present disclosure relates to a light emitting device, a light emitting device package and a lighting system.

A Light Emitting Diode (LED) is fabricated using a P-N junction diode which has characteristics of converting electric energy to light energy. Herein, the P-N junction diode may be formed by compounding elements of group III and group V of the periodic table. The LED may emit various colors by adjusting a composition ratio of compound semiconductors.

Meanwhile, according to the related art, there is a problem that a current inversely flows when Electrostatic Discharge (ESD) occurs so that an active layer which is a light emitting region is damaged. For solving this problem, a zener diode is mounted to a package; however, there is a problem of reducing light absorption in this case.

Further, according to the related art, since the light emitted under an N-type electrode is reflected by the N-type electrode, efficiency of emitting light is reduced. Moreover, according to the related art, due to resorption of the reflected light, heat is generated.

In addition, according to the related art, a lifetime is shortened and reliability is degraded due to current crowding.

SUMMARY

Embodiments provide a light emitting device, a light emitting device package, and a lighting system capable of preventing damage due to Electrostatic Discharge (ESD) without loss of light absorption.

Embodiments also provide a light emitting device, a light emitting device package, and a lighting system capable of not only increasing efficiency of current spreading but also improving light extraction efficiency.

In one embodiment, a light emitting device includes a light emitting structure including a first conductive semiconductor layer, an active layer, and a second conductive semiconductor layer; a first dielectric layer over a part of an upper surface of the light emitting structure; and a pad electrode over the first dielectric layer.

In another embodiment, a light emitting device package includes a package body; the light emitting device arranged on the package body; and an electrode electrically connecting the package body and the light emitting device.

In further another embodiment, a lighting system includes a light emitting module unit provided with the light emitting device package.

BRIEF DESCRIPTION OF THE DRAWINGS

FIG. 1 is a cross-sectional view illustrating a light emitting device according to an embodiment.

FIG. 2 is a concept diagram illustrating an electric field generated when Electrostatic Discharge (ESD) occurs in the light emitting device according to the embodiment.

FIG. 3 is an exemplary circuit diagram illustrating the light emitting device according to the embodiment.

FIG. 4 is a wave diagram illustrating the ESD of the light emitting device according to the embodiment.

FIGS. 5 to 7 are cross-sectional diagrams illustrating a process of fabricating the light emitting device according to the embodiment.

FIG. 8 is a cross-sectional view illustrating a light emitting device according to another embodiment.

FIG. 9 is a cross-sectional view illustrating a light emitting package according to the embodiment.

FIG. 10 is a perspective view illustrating a lighting unit according to the embodiment.

FIG. 11 is an exploded perspective view illustrating a backlight unit according to the embodiment.

DETAILED DESCRIPTION OF THE EMBODIMENTS

Reference will now be made in detail to the embodiments of the present disclosure, examples of which are illustrated in the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

FIG. 1 is a cross-sectional view illustrating a light emitting device according to an embodiment.

A light emitting device 100 according to the embodiment may include a light emitting structure 110 including a first conductive semiconductor layer 112, an active layer 114, and a second conductive semiconductor layer 116, a first dielectric layer 141 formed on a part of an upper surface of the light emitting structure 110, and a pad electrode 160 formed on the first dielectric layer 141.

In the embodiment, a dielectric layer 140 may include the first dielectric layer 141 and a second dielectric layer 142 formed on a side of the light emitting structure 110. Herein, the first dielectric layer 141 and the second dielectric layer 142 may be connected to each other.

In the embodiment, a first electrode 150 may be included on the light emitting structure 110. The pad electrode 160 may be electrically connected to the first electrode 150.

In the embodiment, the pad electrode 160, the first dielectric layer 141 and the light emitting structure 110 may function as a Metal Insulator Semiconductor (MIS) capacitor.

According to the embodiment, for preventing a Light Emitting Diode (LED) from being damaged due to Electrostatic Discharge (ESD), the first dielectric layer 141 is formed by extending the second dielectric layer 142, e.g., a passivation layer, within an LED chip to the part of the upper surface of the light emitting structure 110, and the pad electrode 160 for wire bonding may be formed on the first dielectric layer 141. The pad electrode 160 may be one or more.

Accordingly, since the pad electrode 160 is extended to a region of the first conductive semiconductor layer 112, a current flows to the active layer 114 to generate light when a constant voltage (i.e., forward vias) is supplied; however, when an ESD shock of a pulse form is generated due to the ESD, the energy of the high frequency component passes through the first dielectric layer 141 so that the active layer 114 may be protected.

According to the light emitting device according to the embodiment, the damage due to the ESD may be prevented without loss of light absorption. Further, according to the embodiment, by forming the capacitor within the LED chip for preventing the damage due to the ESD, a cost for fabricating a package may be reduced, a process of the fabricating may be simplified, and the reduction of light absorption may be minimized.

Further, according to the embodiment, the current does not flow to under the pad electrode 160 because of the first dielectric layer 141. The current is diffused to other regions. Accordingly, the first dielectric layer 141 acts as a Current Blocking Layer (CBL) at the constant voltage. Therefore, due to the efficient current flow, reliability is improved and light quantity is increased minimizing the light absorption by the pad electrode.

FIG. 2 is a concept diagram illustrating an electric field generated when the ESD occurs in the light emitting device according to the embodiment. FIG. 3 is an exemplary circuit diagram illustrating the light emitting device according to the embodiment. FIG. 4 is a wave diagram illustrating the ESD of the light emitting device according to the embodiment.

Generally, destruction of the LED due to the ESD occurs when an inverse voltage of a semiconductor is generated. Due to electric charges generated when the inverse voltage is generated, a strong electric field is induced within the LED active region.

And, when the ESD occurs, carriers (electron and hole) are accelerated and collided with atoms so that other carriers are generated, and the generated carriers also generate lots of carriers. This phenomenon is called an avalanche breakdown. If the strong electric filed is induced due to the electric charges so that the ESD not-endurable for the semiconductor is applied, the LED is eventually destructed due to the avalanche breakdown.

Therefore, as illustrated in FIG. 2, according to the embodiment, a capacitor structure of a form of the MIS is inserted so that the electric field loaded to the inside of the LED active layer is partially induced to the MIS capacitor, and thus the electric field of the active region is reduced improving a tolerance to the ESD.

That is, according to the related art, all the strong electric field $Q_0$ due to the electric charges is induced to the LED active region so that the LED destruction occurs by the avalanche breakdown. On the contrary, according to the embodiment, a portion $Q_2$ of the electric field $Q_0$ due to the electric charges is induced to the region of the dielectric layer 140, and thus intensity $Q_1$ of the electric field at the LED active region may be reduced.

FIG. 3 is an exemplary circuit diagram illustrating the light emitting device according to the embodiment.

In the embodiment, the pad electrode 160, the first dielectric layer 141, and the light emitting structure 110 may function as a capacitor $C_D$.

A circuit for the light emitting device according to the embodiment may be implemented as illustrated in FIG. 3. In the case that the voltage is forward according to the constant voltage, the current flows through the LED to generate the light. In the case that the voltage is reverse according to the ESD, the current flows through the MIS capacitor $C_D$.

Herein, in the case that the voltage is reverse according to the ESD, the larger a total capacitance $C_{Tot}$ is, the smaller the current flown to the active layer due to the ESD stress is so that the shock may be reduced.

This is expressed as following equations.

$$Q_{Dis} = C_{ESD} V_{ESD}$$

where $Q_{Dis}$ denotes a charge amount during the discharging, $C_{ESD}$ denotes a capacitance during the discharging $$C'_{Tot} = C_{Diode} + C_D \text{ (with MIS capacitor)}$$

$$C_{Tot} = C_{Diode} \text{ (without MIS capacitor)}$$

$$I = dQ/dt = \Delta Q/\tau = Q_{Dis}/(RC_{Tot}) \therefore C_{Tot}\uparrow \rightarrow I\downarrow$$

$$\therefore I' = Q_{Dis}/(RC') < I = Q_{Dis}/(RC_{Tot})$$

That is, in the case that the voltage is reverse according to the ESD, the larger the total capacitance $C_{Tot}$ is, the smaller the current (I') flown to the active layer due to the ESD stress is so that the shock may be reduced.

FIG. 4 is a wave diagram illustrating the ESD of the light emitting device according to the embodiment.

As illustrated in FIG. 4, a pulse wave has the high frequency component through the Fourier conversion. The steeper a rising time ($t_r$) is, the larger the high frequency component is.

As expressed in following equations, as the frequency becomes higher, impedance (resistance) due to the capacitance becomes smaller. Accordingly, in the case that the voltage is reverse due to the ESD, since the impedance of the MIS capacitor becomes smaller, the high frequency current may flow to the MIS capacitor.

Impedance: $Z = Z_R + jZ_{Im}$ (Zr denotes real impedance, j denotes an imaginary number factor, and $Z_{Im}$ denotes the impedance due to the capacitor)

Capacitor: $Z_{Im,C} = 1/(j\omega C)$ ($\omega = 2\pi f$)

That is, in the case that the voltage is reverse due to the ESD, since the impedance of the MIS capacitor becomes smaller, the high frequency current may flow to the MIS capacitor.

According to the embodiment, the damage due to the ESD may be prevented without loss of light absorption. Further, according to the embodiment, by forming the capacitor within the LED chip for preventing the damage due to the ESD, the cost for fabricating the package may be reduced, the process of the fabricating may be simplified, and the reduction of light absorption may be minimized.

Unexplained numerals of FIG. 1 will be explained describing a method of fabricating the light emitting device below.

Hereinafter, the method of fabricating the light emitting device according to the embodiment will be described referring to FIGS. 5 to 7. In the embodiment, the light emitting device may be formed with group III-V materials such as GaN, GaAs, GaAsP, and GaP, but it is not limited thereto.

Firstly, the light emitting structure 110 may be formed as illustrated in FIG. 5.

For instance, it is explained below that the light emitting structure 110 is formed on a predetermined substrate, and then the predetermined substrate is lifted off. However, the light emitting structure 110 is not limited thereto but may also be formed on a conductive substrate.

Firstly, a first substrate (not illustrated) is prepared. The first substrate includes a conductive or insulative substrate. For instance, at least one of sapphire ($Al_2O_3$), SiC, Si, GaAs, GaN, ZnO, Si, GaP, InP, Ge, and $Ga_2O_3$ may be used for the first substrate. An uneven structure may be formed on the first substrate, but it is not limited thereto.

A wet washing may be performed to the first substrate for eliminating impurities on its surface.

Thereafter, the light emitting structure 110 including the first conductive semiconductor layer 112, the active layer 114, and the second conductive semiconductor layer 116 may be formed on the first substrate.

The light emitting structure 110 may be formed using methods of, e.g., Metal Organic Chemical Vapor Deposition (MOCVD), Chemical Vapor Deposition (CVD), Plasma-Enhanced Chemical Vapor Deposition (PECVD), Molecular Beam Epitaxy (MBE), Hydride Vapor Phase Epitaxy, and the like, but it is not limited thereto.

A buffer layer (not illustrated) may be formed on the first substrate. The buffer layer may reduce lattice mismatching between the materials of the light emitting structure 110 and the first substrate. The buffer layer may be formed with the group III-V compound semiconductor, e.g., at least one of GaN, InN, AlN, InGaN, AlGaN, InAlGaN, and AlInN. An undoped semiconductor layer may be formed on the buffer layer, but it is not limited thereto.

The first conductive semiconductor layer 112 may be embodied with the group III-V compound semiconductor doped with a first conductive dopant. In the case that the first conductive semiconductor layer 112 is an N-type semiconductor layer, the first conductive dopant may include Si, Ge, Sn, Se, and Te as the N-type dopant; however, it is not limited to this.

The first conductive semiconductor layer 112 may include semiconductor material having a composition equation of $In_xAl_yGa_{1-x-y}N$ ($0 \leq x \leq 1$, $0 \leq y \leq 1$, $0 \leq x+y \leq 1$), but it is not limited to this.

The first conductive semiconductor layer 112 may be formed with one or more of GaN, InN, AlN, InGaN, AlGaN, InAlGaN, AlInN, AlGaAs, InGaAs, AlInGaAs, GaP, AlGaP, InGaP, AlInGaP, InP.

For the first conductive semiconductor layer 112, an N-type GaN layer may be formed by using methods of the CVD, MBE, sputtering, or HVPE. Also, the first conductive semiconductor layer 112 may be formed by injecting silane gas ($SiH_4$) including N-type impurities such as trimethyl gallium gas (TMGa), ammonia gas (NH3), nitrogen gas ($N_2$), and silicon (Si) into a chamber.

The active layer 114 emits the light, which is cause by the meeting between the electrons injected through the first conductive semiconductor layer 112 and the holes injected through the second conductive semiconductor layer 116 formed thereafter, having energy determined by a unique energy band of the active layer (light emitting layer) material.

The active layer may be formed as at least one of a single quantum well structure, a Multi Quantum Well (MQW) structure, a quantum wire structure, and a quantum dot structure. For instance, for the active layer 114, the MQW structure may be formed by injecting the trimethyl gallium (TMGa) gas, the ammonia ($NH_3$) gas, the nitrogen ($N_2$) gas, and the trimethyl indium (TMIn) gas, but it is not limited to this.

A structure of well layer/barrier layer of the active layer 114 may be formed as at least one of paired structures of InGaN/GaN, InGaN/InGaN, GaN/AlGaN, InAlGaN/GaN, GaAs(InGaAss)/AlGaAs, and GaP(InGaP)/AlGaP, but it is not limited thereto. The well layer may be formed with material whose band gap is lower than that of the barrier layer.

A conductive clad layer may be formed on or/and under the active layer 114. The conductive clad layer may be formed with an AlGaN-based semiconductor and may have a higher band gap than that of the active layer 114.

The second conductive semiconductor layer 116 may include group III-V compound semiconductor doped with a second conductive dopant, e.g., semiconductor material having the composition equation of $In_xAl_yGa_{1-x-y}N$ ($0 \leq x \leq 1$, $0 \leq y \leq 1$, $0 \leq x+y \leq 1$). The second conductive semiconductor layer 116, e.g., may be selected from GaN, AlN, AlGaN, InGaN, InN, InAlGaN, AlInN, AlGaAs, GaP, GaAs, GaAsP, and AlGaInP. In the case that the second conductive semiconductor layer 116 is a P-type semiconductor layer, the second conductive dopant may include Mg, Zn, Ca, Sr, and Ba as the P-type dopant. The second conductive semiconductor layer 116 may be formed as a single layer or multi layers, but it is not limited to this.

For the second conductive semiconductor layer 116, a P-type GaN layer may be formed by injecting biscetyl cyclopentadienyl magnesium (EtCp2Mg){Mg(C2H5C5H4)2} including P-type impurities such as the trimethyl gallium (TMGa) gas, the ammonia ($NH_3$) gas, the nitrogen ($N_2$) gas, and magnesium (Mg) into the chamber, but it is not limited thereto.

In the embodiment, the first conductive semiconductor layer 112 and the second conductive semiconductor layer 116 may be respectively embodied as the N-type semiconductor layer and the P-type semiconductor layer, but they are not limited thereto. Further, on the second conductive semiconductor layer 116, a semiconductor layer having an opposite polarity to the second conductive type, e.g., an N-type semiconductor layer (not illustrated), may be further formed in the case that the second conductive semiconductor layer is the P-type semiconductor layer. Accordingly, the light emitting structure 110 may be embodied as one structure among N-P junction, P-N junction, N-P-N junction, and P-N-P junction.

Thereafter, a second electrode layer 120 is formed on the second semiconductor layer 116.

The second electrode layer 120 may include an ohmic layer 122, a reflection layer 124, a junction layer (not illustrated), and a support substrate 126. The second electrode layer 120 may be formed with at least one of titan (Ti), chrome (Cr), nickel (Ni), aluminum (Al), platinum (Pt), gold (Au), tungsten (W), and impurities-injected semiconductor substrate.

For instance, the second electrode layer 120 may include the ohmic layer 122. The ohmic layer 122 may be formed by multi-layering single metal, metal compound or metal oxide for efficient hole injection. For instance, the ohmic layer 122 may be formed including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but it is not limited to such materials.

In the embodiment, a current blocking layer 130 may be formed at a partial region of the ohmic layer 122. For instance, the current blocking layer 130 may be formed with an insulating layer, an ion injection layer, and an amorphous layer vertically under the first electrode 150 to be formed later for helping the current diffusion.

The reflection layer 122 may be formed with metal or alloy including at least one of Ag, Ni, Al, Rh, Pd, Ir, Ru, Mg, Zn, Pt, Au, and Hf. The reflection layer 122 may also be formed as multi layers by using the metal or alloy and translucent conductive material such as IZO, IZTO, IAZO, IGZO, IGTO, AZO, and ATO. For instance, the reflection layer 122 may be formed as IZO/Ni, AZO/Ag, IZO/Ag/Ni, and AZO/Ag/Ni.

In the case that the second electrode layer 120 includes the junction layer, the reflection layer 122 may also function as the junction layer, or barrier metal or bonding metal may be included. For instance, the junction layer may include at least one of Ti, Au, Sn, Ni, Cr, Ga, In, Bi, Cu, Ag or Ta.

The second electrode layer 120 may also include the conductive support substrate 126. The conductive support substrate 126 supports the light emitting structure 110 and may provide the power to the light emitting structure 110. The conductive support substrate 126 may be formed with metal, metal alloy, or conductive semiconductor material having excellent electric conductivity.

For instance, the conductive support substrate 126 may include at least one of copper (Cu), copper alloy (Cu alloy), gold (Au), nickel (Ni), molybdenum (Mo), copper-tungsten (Cu—W), and carrier wafer (e.g., Si, Ge, GaAs, GaN, ZnO, SiGe, and SiC).

A thickness of the conductive support substrate 126 may be different according to a design of the light emitting device. For instance, the conductive support substrate 126 may have the thickness of from about 30 μm to about 500 μm.

For forming the conductive support substrate 124, methods of electrochemical metal deposition, plating, or bonding using eutectic metal may be used.

Next, the first substrate is removed so that the first conductive semiconductor layer 112 is exposed. For removing the first substrate, a method of using high-output laser for separating the first substrate or a method of chemical etching may be used. The first substrate may also be removed by physically grinding it. The elimination of the first substrate exposes the first conductive semiconductor layer 112 or the undoped semiconductor layer.

Thereafter, for forming the dielectric layer 140 on the light emitting structure 110, a part of a side of the light emitting structure 110 and a part of the second electrode layer 120 may be removed, but it is not limited thereto.

Next, as illustrated in FIG. 6, the dielectric layer 140 may be formed at the part of the upper surface and the side of the light emitting structure 110. In the embodiment, the dielectric layer 140 may include the first dielectric layer 141 formed at the partial upper surface of the light emitting structure 110 and the second dielectric layer 142 formed at the side of the light emitting structure 110. Herein, the first dielectric layer 141 and the second dielectric layer 142 may be connected to each other.

The dielectric layer 140 may be formed by using an oxide layer and a nitride layer such as $SiO_2$, $TiO_2$, $Al_2O_3$, and SiN, but it is not limited thereto.

Next, as illustrated in FIG. 7, the pad electrode 160 is formed on the first dielectric layer 141. Herein, the first electrode 150 may be formed on the light emitting structure 110, and the pad electrode 160 and the first electrode 150 may be electrically connected to each other.

The pad electrode 160 may be more than one. For instance, even in the case of a vertical light emitting device, a plurality of pad electrodes 160 may be formed in the case of large-sized LED.

According to the embodiment, for preventing the LED from being damaged due to the ESD, the first dielectric layer 141 is formed by extending the passivation layer within the LED chip to the part of the upper surface of the light emitting structure 110, and the pad electrode 160 for wire bonding may be formed on the first dielectric layer 141.

Accordingly, since the pad electrode 160 is extended to the region of the first conductive semiconductor layer 112, the current flows to the active layer 114 to generate the light when the constant voltage (DC) is supplied; however, when the ESD shock of the pulse form is generated due to the ESD, the energy of the high frequency component passes through the first dielectric layer 141 so that the active layer 114 may be protected.

Further, according to the embodiment, the current does not flow to under the pad electrode 160 because of the first dielectric layer 141. The current is diffused to other regions.

Accordingly, the first dielectric layer 141 acts as the CBL at the constant voltage. Therefore, due to the efficient current flow, the reliability is improved and the light quantity is increased minimizing the light absorption by the pad electrode.

According to the light emitting device, the method of fabricating the light emitting device and the light emitting device package according to the embodiment, the damage due to the ESD may be prevented without loss of light absorption.

Further, by forming the capacitor within the LED chip for preventing the electrostatic damage, the cost for fabricating the package may be reduced, the process of the fabricating may be simplified, and the reduction of light absorption may be minimized.

Furthermore, according to the embodiment, by the efficient control of the current flow, the light extraction efficiency may be increased.

In addition, according to the embodiment, by the current spreading, the reliability of the light emitting device may be improved.

FIG. 8 is a cross-sectional view illustrating a light emitting device according to another embodiment.

A light emitting device 102 according to the other embodiment may include a light emitting structure 110 including a first conductive semiconductor layer 112, an active layer 114, and a second conductive semiconductor layer 116, a first dielectric layer 141 formed on a part of an upper surface of the light emitting structure 110, and a pad electrode 160 formed on the first dielectric layer 141.

In the embodiment, a dielectric layer 140 may include the first dielectric layer 141 and a second dielectric layer 142 formed on a side of the light emitting structure 110. Herein, the first dielectric layer 141 and the second dielectric layer 142 may be connected to each other.

In the embodiment, a first electrode 150 may be included on the light emitting structure 110. The pad electrode 160 may be electrically connected to the first electrode 150.

An uneven part R may be formed at the upper surface of the light emitting structure 110 to improving the light extraction efficiency.

A second electrode layer 120 is formed under the light emitting structure 110. The second electrode layer 120 may include an ohmic layer 122, a reflection layer 124, a junction layer 125, and a support substrate 126.

A protection member 190 may be formed obliquely below the light emitting structure 110. A Current Blocking Layer (CBL) 130 may be formed between the light emitting structure 110 and the ohmic layer 122.

The protection member 190 may be formed circumferentially between the light emitting structure 110 and the junction layer 125. Accordingly, the protection member 190 may be formed as a ring shape, a loop shape, or a square shape. A part of the protection member 190 may be overlapped with the light emitting structure 110 in a vertical direction.

The protection member 190 may reduce a possibility of a short circuit between the junction layer 125 and the active layer 114 by increasing a distance between each side of the junction layer 125 and the active layer 114.

The protection member 190 may also prevent occurrence of the short circuit during a chip separation process.

The protection member 190 may be formed with electric insulative material, material having lower electric conductivity than the reflection layer 124 or the junction layer 125, or material forming a Schottky connection with the second conductive semiconductor layer 116. For instance, the protection member 190 may include at least one of ITO, IZO, IZTO, IAZO, IGZO, IGTO, AZO, ATO, ZnO, SiO2, SiOx, SiOxNy, Si3N4, Al2O3, TiOx, TiO2, Ti, Al or Cr.

FIG. 9 is a cross-sectional view illustrating a light emitting package 200 according to the embodiment.

Referring to FIG. 9, the light emitting device package 200 according to the embodiment includes a package body unit 205, a third electrode layer 213 and a fourth electrode layer 214 installed to the package body unit 205, a light emitting device 100 installed to the package body unit 205 and electrically connected to the third electrode layer 213 and the fourth electrode layer 214, and a molding member 240 surrounding the light emitting device 100.

The package unit 205 may be formed including silicon material, synthetic resins material, or metal material, and a slope surface may be formed around the light emitting device 100.

The third electrode layer 213 and the fourth electrode layer 214 are electrically separated from each other and serve to provide the power to the light emitting device 100. The third electrode layer 213 and the fourth electrode layer 214 may also serve to increase the light efficiency by reflecting the light generated at the light emitting device 100 and emit heat generated by the light emitting device 100 to the outside.

The vertical-type light emitting device illustrated in FIG. 1 may be adopted for the light emitting device 100, but it is not limited thereto.

The light emitting device 100 may be installed on the package body unit 205 or on the third electrode layer 213 or the fourth electrode layer 214.

The light emitting device 100 may be electrically connected to the third electrode layer 213 and/or the fourth electrode layer 214 in one method of a wire method, a flip chip method, and a die bonding method. In the embodiment, the light emitting device 100 is electrically connected to the third electrode layer 213 through a wire 230 and is electrically and directly contacted to the fourth electrode layer 214.

The molding member 240 may protect the light emitting device 100 by surrounding it. The molding member 240 may include a fluorescent substance so that a wavelength of the light emitted from the light emitting device 100 may be changed.

A plurality of light emitting device packages according to the embodiment is arrayed on a substrate. On a path of the light emitted from the light emitting device package, optical members such as a light guide plate, a prism sheet, a diffusion sheet, and a fluorescent sheet. The light emitting device package, the substrate, and the optical members may be function as a backlight unit or a lighting unit. For instance, the lighting system may include the backlight unit, the lighting unit, an indication device, a lamp, and a street lamp.

FIG. 10 is a perspective view illustrating a lighting unit 1100 according to the embodiment.

Referring to FIG. 10, the lighting unit 1100 may include a case body 1110, a light emitting module 1130 installed to the case body 1110, and a connection terminal 1120 installed to the case body 1110 and provided with power from an external power source.

It is preferable to form the case body 1110 with material which has excellent heat radiation characteristics. For instance, the case body 1110 may be formed with metal material or resin material.

The light emitting module 1130 may include a substrate 1132 and at least one light emitting device package 200 installed to the substrate 1132.

The substrate 1132 may be an insulator where a circuit pattern is printed. For instance, the substrate 1132 may include a typical Printed Circuit Board (PCB), a metal core PCB, a flexible PCB, and a ceramic PCB.

The substrate 1132 may also be formed with material which efficiently reflects light, or its surface may be coated with color, e.g., white and silver, which efficiently reflects light.

At least one light emitting device package 200 may be installed on the substrate 1132. Each light emitting device package 200 may include at least one LED 100. The LED 100 may include a light emitting diode of visible light such as red, green, blue, or white or a UV light emitting diode which emits Ultra Violet (UV).

A combination of various light emitting device packages 200 may be disposed in the light emitting module 1130 for obtaining color tone and brightness. For instance, for securing high Color Rendering Index (CRI), a white light emitting diode, a red light emitting diode, and a green light emitting diode may be combined and disposed.

The connection terminal 1120 may be electrically connected to the light emitting module 1130 to supply power. The connection terminal 1120 is screwed to be connected to the external power source in a socket method; however, there is no limit for this. For instance, the connection terminal 1120 may be formed as a pin shape to be inserted into the external power source or may be connected to the external power source by a wire.

FIG. 11 is an exploded perspective view illustrating a backlight unit 1200 according to the embodiment.

The backlight unit 1200 according to the embodiment may include a light guide plate 1210, a light emitting module 1240 providing light to the light guide plate 1210, a reflection member 1220 under the light guide plate 1210, and a bottom cover 1230 storing the light guide 1210, the light emitting module 1240, and the reflection member 1220; however, it is not limited thereto.

The light guide plate 1210 serves to diffuse light for convergence to a surface light source. The light guide plate 1210 is formed with transparent material and, e.g., may include one of acrylic resin such as polymethyl metaacrylate (PMMA), polyethylene terephthlate (PET), poly carbonate (PC), cycloolefin copolymer (COC), and polyethylene naphthalate (PEN) resins.

The light emitting module 1240 provides light to at least one side of the light guide plate 1210 and ultimately functions as a light source of a display device where the backlight unit 1200 is installed.

The light emitting module 1240 may be contacted to the light guide 1210, but it is not limited thereto. Specifically, the light emitting module 1240 includes a substrate 1242 and a plurality of light emitting device packages 200 installed to the substrate 1242. Herein, the substrate 1242 may be contacted to the light guide plate 1210, but it is not limited thereto.

The substrate 1242 may be the PCB including a circuit pattern (not illustrated). However, the substrate 1242 may include not only the typical PCB but also the metal core PCB (MCPCB) and the flexible PCB (FPCB), and it is not limited thereto.

The plurality of light emitting device packages 200 may be installed on the substrate 1242 so that a light-emitting surface is separated from the light guide plate 1210 by a predetermined distance.

The reflection member 1220 may be formed under the light guide plate 1210. The reflection member 1220 reflects the light incident to the lower surface of the light guide plate 1210 in an upward direction so that brightness of the backlight unit 1200 may be improved. The reflection member 1220 may be formed with, e.g., PET, PC, and PVC resins; however, it is not limited thereto.

The bottom cover 1230 may store the light guide plate 1210, the light emitting module 1240, and the reflection member 1220. To this end, the bottom cover 1230 may be formed as a boxlike whose upper surface is open, and there is no limit for this.

The bottom cover 1230 may be formed with metal material or resin material and may be fabricated using processes of press or extrusion molding.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a light emitting structure comprising a first conductive semiconductor layer, an active layer, and a second conductive semiconductor layer;
   a dielectric layer on a part of an upper surface of the light emitting structure and on a side of the light emitting structure;
   a pad electrode over the dielectric layer and
   a first electrode layer under the light emitting structure,
   wherein at least a portion of the first electrode layer is connected to the dielectric layer.

2. The light emitting device according to claim 1, further comprising a second electrode over the light emitting structure.

3. The light emitting device according to claim 2, wherein the pad electrode and the second electrode are electrically connected to each other.

4. The light emitting device according to claim 1, further comprising a CBL within the second electrode layer.

5. The light emitting device according to claim 4, further comprising a second electrode, wherein at least a part of the CBL is overlapped with the second electrode vertically.

6. The light emitting device according to claim 1, further comprising a protection member circumferentially under the light emitting structure.

7. The light emitting device according to claim 6, wherein the protection member is formed with electric insulative material or material forming a Schottky connection with the second conductive semiconductor layer.

8. A light emitting device package, comprising:
   a package body;
   a light emitting device of claim 1 arranged on the package body; and
   an electrode electrically connecting the package body and the light emitting device.

9. A lighting system comprising a light emitting module unit provided with a light emitting device package of claim 8.

10. The light emitting device according to claim 1,
    wherein the dielectric layer comprises a second dielectric layer on the part of an upper surface of the light emitting structure and a first dielectric layer on the side of the light emitting structure,
    wherein the pad electrode is on the second dielectric layer,
    wherein the first dielectric layer and the second dielectric layer are connected to each other, and
    wherein the first electrode layer is contacted with the first dielectric layer.

11. The light emitting device according to claim 10, wherein the pad electrode, the second dielectric layer, and the light emitting structure function as a Metal Insulator Semiconductor (MIS) capacitor.

12. The light emitting device according to claim 10, wherein a current does not flow under the pad electrode due to existence of the second dielectric layer and the current is diffused to other regions.

13. The light emitting device according to claim 12, wherein the second dielectric layer acts as a Current Blocking Layer (CBL) when a voltage is supplied.

* * * * *